United States Patent [19]
Hallmark

[11] Patent Number: 6,121,543
[45] Date of Patent: Sep. 19, 2000

[54] GROUNDBED ELECTRODE WITH GRAPHITE CONTAINING CEMENT

[76] Inventor: Clayton L. Hallmark, 107 Weller Rd., Shelby, Ohio 44875

[21] Appl. No.: 09/110,358

[22] Filed: Jul. 6, 1998

[51] Int. Cl.⁷ ..................................................... H01R 4/66
[52] U.S. Cl. ................................................ 174/6; 106/717
[58] Field of Search ................................. 174/5 R, 55 G, 174/6, 7, 1, 68.1; 106/717

[56] References Cited

U.S. PATENT DOCUMENTS

| | | | |
|---|---|---|---|
| 3,626,149 | 12/1971 | Carney et al. | 219/213 |
| 3,725,669 | 4/1973 | Tatum | 307/95 |
| 4,544,464 | 10/1985 | Bianchi et al. | 204/147 |
| 4,786,388 | 11/1988 | Tatum, Jr. | 204/197 |
| 4,994,629 | 2/1991 | Tatum, Jr. et al. | 174/6 |

FOREIGN PATENT DOCUMENTS

| | | |
|---|---|---|
| 56-126283 | 10/1981 | Japan . |
| 62-12644 | 1/1987 | Japan . |
| 1248441 | 7/1973 | United Kingdom . |

*Primary Examiner*—Jeffrey Gaffin
*Assistant Examiner*—Kamand Cuneo
*Attorney, Agent, or Firm*—Thomas S. Baker, Jr.

[57] ABSTRACT

A groundbed electrode for the protection of an electrical/electronic equipment installation is comprised of a strip of a mixture of approximately equal parts, on a volumetric basis, of powdered crystalline carbon and Portland cement buried in earth, a copper electrical conductor wire embedded in the buried strip, and with the electrical conductor wire being connected to the electrical/electronic equipment in electrical current-conducting relation.

4 Claims, No Drawings

GROUNDBED ELECTRODE WITH GRAPHITE CONTAINING CEMENT

CROSS-REFERENCES

None.

FIELD OF THE INVENTION

This invention pertains generally to electrical/electronic equipment installations, and particularly concerns an improved groundbed electrode which may be advantageously utilized to protect such equipment installations from damage otherwise caused by natural voltage surges such as lightning or by other effects such as ground faults and ground potential rise.

BACKGROUND OF THE INVENTION

Various electrical grounding techniques have been utilized in the electric power and telecommunications industries in the United States to protect electrical/electronic equipment installations from damage otherwise caused by natural phenomena such as lightning strikes to which the equipment installations may be exposed.

Such known techniques include the use of wires and rods of copper or another electrically conductive metal electrically connected to the equipment installations and buried or driven into the earth, chemical grounding rods whose constituent electrically-conductive chemicals leach and dissipate into adjacent earth soil to be effective, and electrical conductors embedded in a protective cementitious casing containing a powdered amorphous graphite constituent.

However, the use of such known grounding techniques has frequently been limited, often because of total-cost considerations or because technical requirements such as low electrical current surge impedance have proved to be unobtainable. Often specific equipment application may involve installation sites with limited available ground areas, with high-resistivity soils, or with shallow soil depths to bedrock.

I have discovered that in many known electrical/electronic equipment installations having stringent technical requirements such requirements can be met and disadvantages of the prior art overcome through utilization of a novel equipment groundbed electrode construction.

Other advantages of the present invention will likely become apparent from careful consideration of the summaries, detailed descriptions, and claims which follow.

SUMMARY OF THE INVENTION

The groundbed electrode of the present invention basically comprises a horizontally-oriented copper (or other electrically-conductive metal) conductor embedded in a cured, horizontally-oriented cementitious sheath containing approximately equal parts, by volume, of Portland cement and powdered crystalline carbon. Depending on specific application trade-offs, the embedding cementitious sheath may consist of, on a volumetric ratio basis, from approximately 45 parts to approximately 55 parts crystalline carbon powder and the balance Portland cement.

In most specific applications of the groundbed electrode of the present invention, a relatively shallow trench of proper length is first dug in the earth adjacent the equipment installation to be protected, the trench is partially-filled with the novel crystalline carbon-containing cementitious material, sometimes in water slurry form and sometimes in powder form, and the equipment copper wire (or other electrically-conductive metallic) grounding conductor wire is embedded in an cementitious material fill. Afterwards the trench is back-filled with previously-removed earth, preferably tamped, and the conductor electrically connected to the equipment to be protected.

BRIEF DESCRIPTION OF THE DRAWINGS

No drawings provided.

DETAILED DESCRIPTION

The following Table 1 provides details of three different proportions or ratios of powdered crystalline carbon (often also referred to as graphite or as an electrographitic material) to bulk Portland cement utilized in the practice of the present groundbed electrode invention, and the electrical resistivity and strength properties associated with those composition ratios.

TABLE 1

| Carbon:cement Ratio | Resistivity | Strength |
|---|---|---|
| 45%:55% | >2 ohm-cm | Hard, difficult to break with fingers. |
| 50%:50% | ≈2 ohm-cm | Hard, brittle. |
| 55%:45% | <2 ohm-cm | Softer, easy to crumble with fingers. |

Note that the approximate powdered crystalline carbon percentage to bulk Portland cement percentage ratios given above are on a volumetric basis. Also, the electrical resistivity values are stated in approximate ohm-centimeter values.

In a representative installation of the groundbed electrode of the present invention it is necessary to first provide a continuous trench from immediately adjacent the support pad or support foundation upon which the electrical/electronic equipment to be protected is to be placed. The bottom of such trench is dug to normally be within approximately 20 to 30 inches of the earth surface. The width of the trench (and electrode) is at least eight times the electrode thickness, which is approximately 2 inches to thereby result in an electrode generally rectangular cross-section of approximately 2 inches by 16 inches or more. The length of the trench, depending upon soil electrical resistivity characteristics, may have a length to as much as approximately 600 lineal feet.

The so-provided trench is next partially filled with the desired powdered crystalline carbon/Portland cement mixture typically to an in-place cross-section of approximately 20 to 60 square inches, and the installation conductor, often 4/0 AWG copper conductor, is embedded in the in-place conductive crystalline carbon (graphite) and cement mixture. Note that placement of the crystalline carbon (graphite) and cement mixture, in the open trench and subsequent conductor embedment sometimes may involve placement of the crystalline carbon (graphite) and cement mixture as a water slurry and sometimes may involve placement of the crystalline carbon (graphite) and cement mixture, as a bulk powder. In the latter case, hydration of the mixture occurs using ground water from the soil.

Afterwards the so-placed cementitious mixture and embedded conductor are covered with soil and the trench backfilled, the backfill soil is tamped and leveled, and the electrical conductor electrically connected to the electrical/ electronic equipment to be protected by a joining metallic wire or other well-known, functionally-equivalent, electrical connector means. Depending upon application, such equipment may be a telecommunications tower, an electronic equipment storage cabinet, a power distribution sub-station, or the like.

I claim my invention as follows:

1. A grounded electrical or electronic equipment installation comprising, in combination:

installation electrical or electronic equipment;

a solidified strip of powdered cementitious material mixture having, on a 100 parts volumetric basis, 45 to 55 parts of crystalline carbon and the remainder parts of Portland cement;

a copper electrical grounding conductor embedded in said solidified strip of powdered cementitious material mixture; and means for connecting said embedded electrical grounding conductor to said installation electrical or electronic equipment in electrical current-conducting relation, said solidified strip of powdered cementitious material mixture with embedded electrical grounding conductor being adapted for complete burial in earth.

2. The invention defined by claim 1 wherein said solidified strip of powdered cementitious material mixture is comprised, on a volumetric basis, of equal parts of crystalline carbon and Portland cement.

3. The invention defined by claim 1, and wherein said solidified strip of powdered cementitious material mixture is oriented generally parallel to the surface of the earth in which it is adapted to be completely buried.

4. The invention defined by claim 1 wherein said solidified strip of powdered cementitious material mixture has a generally-rectangular cross-section, said generally-rectangular cross-section having an orthogonal maximum dimension that in magnitude is at least eight (8) times the orthogonal minimum dimension of said generally-rectangular cross-section.

* * * * *